United States Patent
Ward

(10) Patent No.: US 9,805,453 B2
(45) Date of Patent: Oct. 31, 2017

(54) FLOW IMAGING

(71) Applicant: General Electric Company, Schenectady, NY (US)

(72) Inventor: John Robert Ward, Leicester (GB)

(73) Assignee: General Electric Company, Schenectady, NY (US)

( * ) Notice: Subject to any disclaimer, the term of this patent is extended or adjusted under 35 U.S.C. 154(b) by 26 days.

(21) Appl. No.: 14/300,250

(22) Filed: Jun. 10, 2014

(65) Prior Publication Data

US 2014/0369624 A1 Dec. 18, 2014

(30) Foreign Application Priority Data

Jun. 13, 2013 (GB) .................................. 1310526.7

(51) Int. Cl.
- *G06K 9/40* (2006.01)
- *G06T 5/50* (2006.01)
- *H03M 1/12* (2006.01)
- *G06T 5/00* (2006.01)

(52) U.S. Cl.
CPC ................ *G06T 5/50* (2013.01); *G06T 5/002* (2013.01); *H03M 1/1295* (2013.01); *G06T 2207/10132* (2013.01); *G06T 2207/20224* (2013.01)

(58) Field of Classification Search
CPC . G06T 5/50; G06T 5/002; G06T 2207/10132; G06T 2207/20224; H03M 1/1295
USPC ......................... 382/128, 130, 275
See application file for complete search history.

(56) References Cited

U.S. PATENT DOCUMENTS

| | | | |
|---|---|---|---|
| 6,267,725 B1 * | 7/2001 | Dubberstein | ................. 600/443 |
| 6,406,430 B1 | 6/2002 | Ishrak et al. | |
| 6,486,811 B2 | 11/2002 | Clara | |
| 2006/0001558 A1 | 1/2006 | Kim et al. | |

(Continued)

FOREIGN PATENT DOCUMENTS

| | | | |
|---|---|---|---|
| CN | 1194368 A | 9/1998 | |
| DE | 3836823 A1 * | 5/1990 | .............. H03M 1/12 |
| EP | 0947853 A2 | 10/1999 | |

OTHER PUBLICATIONS

Search Report issued in connection with corresponding GB Application, Serial No. 1310526.7 on Dec. 5, 2013.

(Continued)

*Primary Examiner* — Andrew Moyer
(74) *Attorney, Agent, or Firm* — GE Global Patent Operation

(57) ABSTRACT

A system suitable for reducing static or slow moving echoes from acoustic boundaries in a system such as pipe walls, blood vessels, tissue structures so that an image from flowing or time varying media such as water, oil, blood etc may be imaged more clearly, the system including an analog-to-digital converter for digitizing a received analog signal from a detector, means for digitally separating static or slow moving components of the digital signal, a digital-to-analog converter to provide an analog version of the separated static or slow moving components of the signal, and a subtractor to subtract the analog version of the static or the slow moving components of the signal from an analog signal received from a detector to produce an analog signal corresponding to the remaining flow components of the signal.

6 Claims, 7 Drawing Sheets

(56) References Cited

U.S. PATENT DOCUMENTS

2013/0021018 A1  1/2013  Venkataraman et al.
2013/0030726 A1  1/2013  Thomas

OTHER PUBLICATIONS

"The Effect of Echo Suppression on the Mean Velocity Estimation Range of the RF Cross-Correlation Model Estimator", Ultrasound in Med. & Biol., vol. 21, No. 7, pp. 945-959, 1995, Elsevier Science Ltd.
European Search Report and Opinion issued in connection with corresponding EP Application No. 14172010.2 on Feb. 3, 2015.
Chinese Office Action issued in connection with corresponding CN Application No. 201410264359.X dated Jun. 1, 2017.

* cited by examiner

FLOW IMAGING

BACKGROUND OF THE INVENTION

The present invention relates to flow imaging, in particular to suppression of echoes from stationary or slow moving reflections in an image.

Flow of media through a conduit, such as fluid through a pipe or blood through a blood vessel for example, may be imaged by transmitting waves such as ultrasound waves into the conduit and detecting echoes reflected from the flowing media and the surrounding structure. However, a problem with such imaging is that echoes from stationary or slow moving reflecting acoustic boundaries in the system such as pipe walls, blood vessels, tissue structures etc are far stronger than those from the flowing or time varying media such as water, oil, blood etc. The stationary or slow moving echoes may for example be 100 times larger than the echoes from the flowing media such that it is very difficult to precisely determine data for the flowing media.

In order to more precisely determine the data for the flowing media, the signal for the static or slow moving reflections is generally cancelled in the digital domain by digitally subtracting the static or slow moving element from the digitized incoming signal, as shown for example in EP 0 947 853. However, because of the very large difference between the magnitude of the signal from the static or slow moving reflections and the signal for the flowing media, for example 100:1, only a very small proportion of the resolution of the analogue-to-digital converter is used to digitize the portion of the incoming signal relating to the flowing media of interest, for example 1%. Furthermore, the extent to which the combined analogue signal can be amplified prior to analogue-to-digital conversion is limited by the need not to clip the static element, which has the flowing data of interest superimposed upon it, so that data is not lost. A high resolution analogue-to-digital converter is sometimes used but this can be very expensive often comprises the sampling rate possible.

It would be desirable to be able to reduce or remove the portion of a signal relating to echoes from static or slow moving reflecting acoustic boundaries in an image whilst overcoming or reducing one or more of the problems explained above.

BRIEF SUMMARY OF THE INVENTION

According to a first aspect of the present invention, there is provided a system suitable for reducing static or slow moving echoes from an image, the system comprising: an analogue-to-digital converter for digitizing a received analogue signal from a detector; means for digitally separating static or slow moving components of the digital signal; a digital-to-analogue converter to provide an analogue version of the separated static or slow moving components of the signal and a subtractor to subtract the analogue version of the static or slow moving components of the signal from an analogue signal received from a detector to produce an analogue signal corresponding to the remaining flow components of the signal.

Subtracting the static or slow moving component from the incoming measured signal in the analogue domain allows a resultant analogue difference signal to be produced corresponding to the flowing media of interest. This analogue signal corresponding to the flowing media of interest may then be amplified to a much greater degree without being clipped by the analogue-to-digital converter, producing a far better signal to noise ratio in the subsequently processed and displayed signal.

An amplifier with a controllable gain, in an embodiment, may be provided to receive the subtracted analogue signal corresponding to the flow components of the signal so that the extent to which the signal is amplified is dependent upon its gain setting. Controlling the gain of the amplifier enables the input range of the analogue-to-digital converter to be more fully utilised for more precise results.

An imaging system may be provided including a transducer array, a transmitter, a receiver, an output for a display and the system for reducing static and slow moving echoes from an image of the first aspect of the present invention. The system could be provided in the receiver or form part of a controller for the imaging system for example.

According to a second aspect of the present invention, there is provided a method for reducing static or slow moving echoes from an image, the method comprising digitizing an incoming analogue signal from a detector, separating the static or slow moving components of the digitized signal, converting the separated static or slow moving components into an analogue signal and subtracting the analogue version of the static or slow moving components from an analogue signal received from detector to produce an analogue signal corresponding to the flow components of the image.

BRIEF DESCRIPTION OF THE DRAWINGS

Examples of the present invention will now be described, by way of example only, with reference to the accompanying drawings in which.

DETAILED DESCRIPTION

Figure 1:
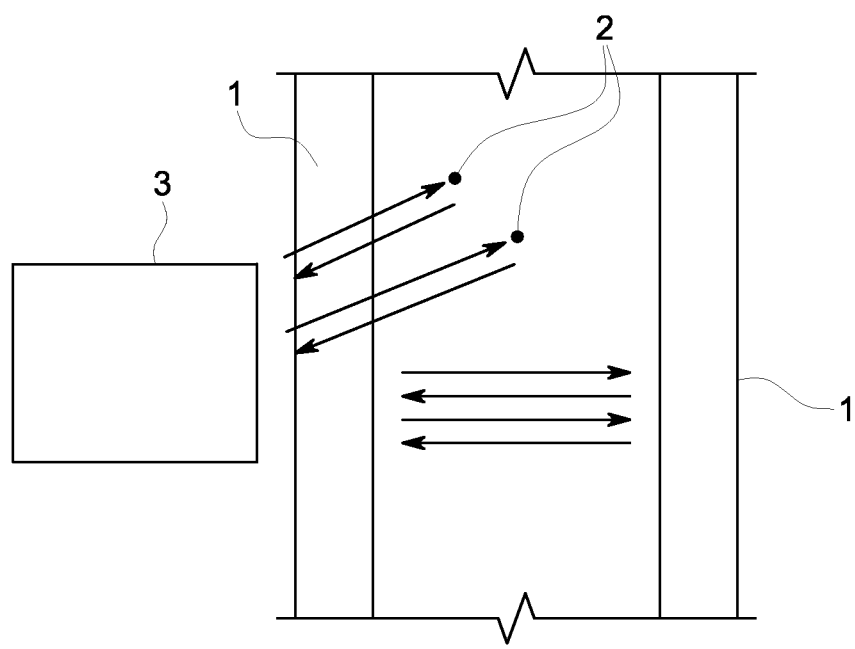
FIG. 1 illustrates flow of media through a conduit.

FIG. 1 shows a conduit 1 which may, for example, be a tube or pipe such as a portion of a pipeline, a water pipe, a blood vessel or artery. The conduit 1 is arranged to convey a flowing or time varying media such as water, oil, gas or mixtures thereof or bodily fluids such as blood. Particles or bubbles 2 within the flowing media produce echoes when a transmitting/receiving transducer 3 of an imaging system is used to form an image of the flowing media. However, echoes from the walls of the conduit 1 produce time-static or slow moving (for example due to temperature variations in the conduit) echoes which are much larger than the echoes produced by the flowing media 2. The echoes form the conduit 1 may be even larger due to multiple reflections within the conduit 1. These static or slow moving echoes may be typically 100 times larger than echoes from the flowing media such that any imaging produced from the flowing media 2 is only seen at a very low resolution.

Figure 2:
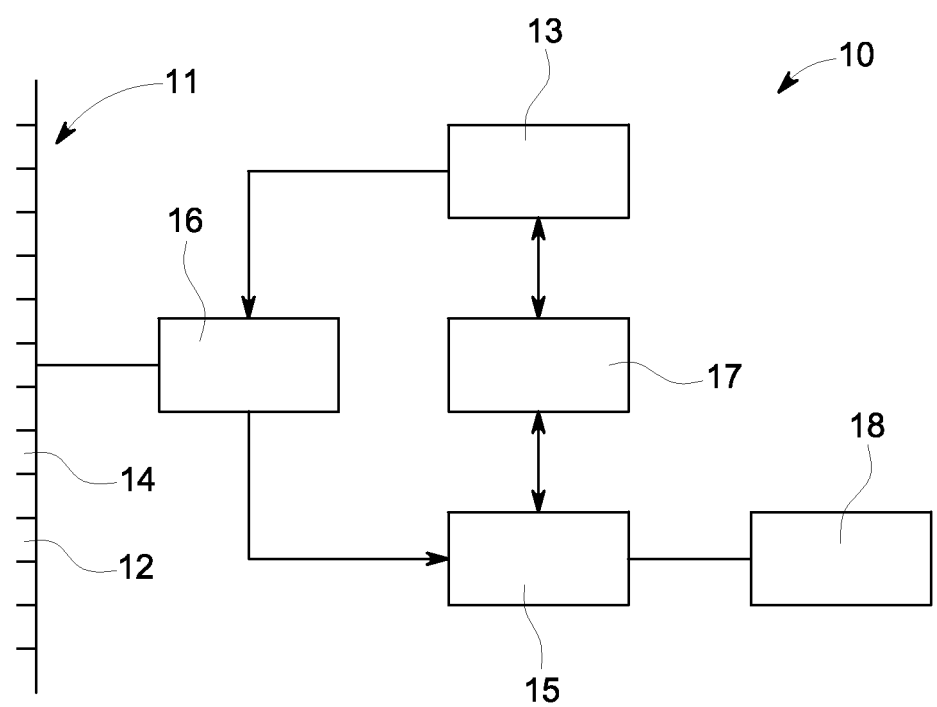
FIG. 2 shows an example of an imaging system which may be used with an example of the present invention.

FIG. 2 shows an example of an imaging system 10 suitable for producing images of a flowing media 2. In this example the imaging system 10 uses ultrasonic waves but any suitable signal may be used such as magnetic, optical, thermal, electrical impedance, sound waves or microwaves for example. The imaging system 10 of this example has a transducer array 11 comprising a plurality of transducer elements 12, each of which may be separately driven and each of which produces a burst of ultrasonic energy when energised by a pulsed waveform produced by a transmitter 13. The ultrasonic energy reflected back to the transducer array 11 from a flowing media such as shown in FIG. 1 is converted to an electrical signal by a receiving transducer element 14 which may be in the same transmitting transducer array 11 or a separate receiving transducer. The electrical signals from the receiving transducer elements 14 are applied to a receiver 15 through a set of transmit/receive switches 16. The transmit/receive switches 16 are typically semiconductors which protect the receive electronics from the high voltages generated by the transmit electronics. The transmit signal causes the semiconductor protection to limit the signal to the receiver 15. The transmitter 13 and receiver 15 may be operated under the control of a synchronizing controller 17.

A scan may be performed by acquiring a series of echoes in which the transmitter 13 is gated ON momentarily to energise each transmitting transducer element 12 and the subsequent echo signals produced by each receiving transducer element are applied to the receiver 15. The receiver 15 combines the separate echo signals from each transducer element to produce a single echo signal which is used to produce a line in an image which may be provided on a display monitor 18.

Figure 3:
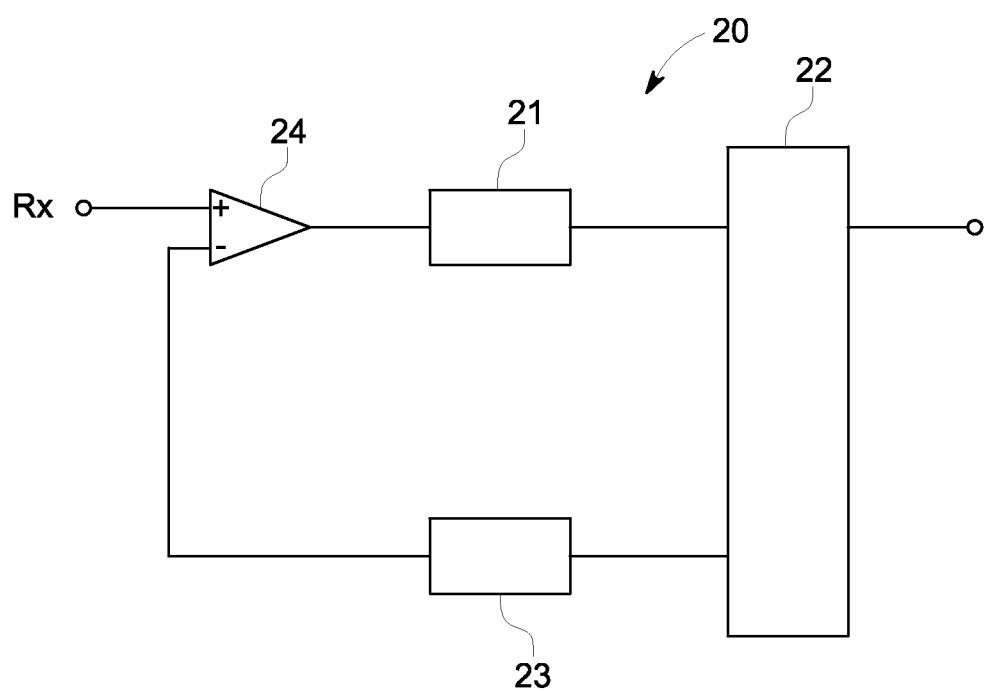
FIG. 3 shows an example of a system illustrating our invention for reducing static or slow moving echoes from an image.

FIG. 3 shows an example of a system illustrating an embodiment of the invention suitable for reducing or substantially removing the static or slow moving echoes from an image. The system 20 includes an analogue-to-digital converter 21 for digitising a received analogue signal from a detector 11 via the node Rx. Means 22 is provided for digitally separating the static or slow moving component from the digitised signal from the analogue-to-digital converter 21. Any suitable separator 22 may be used such as a low pass filter, a decimation filter or the use of an appropriate software function in a suitable processor for example to provide the static or slow moving components of the signal. A digital-to-analogue converter 23 is provided to receive the separated static or slow moving components of the signal and provide an analogue version of the separated static or slow moving components of the signal. A subtractor 24 is then used to subtract the analogue version of the static or slow moving components of the signal provided by digital-to-analogue convertor 23 from the analogue input provided by a transducer from node Rx to produce an analogue signal corresponding to the remaining flow components of the signal. The resultant signal represents echoes from the flowing media 2 and is digitised 21 and may be displayed 18. As the static or slow moving component of the incoming measured signal is subtracted in the analogue domain, a resultant analogue difference signal corresponding to the flowing media of interest is produced which has a much higher signal to noise ratio. The signal with the much higher signal to noise ratio may then be processed to provide a far higher resolution measurement and image of the flowing media 2.

One or more of the components of the system 21, 22, 23, 24, such as the digital-to-analogue converter 23, in an embodiment, is arranged to operate at an appropriate sample rate such that it seeks a sample value at appropriate time points or acquisition windows that leads to a net zero static or slow moving signal at the analogue-to-digital converter 21. An algorithm may be used to separate the static or slow moving components of the signal. The algorithm may be adaptive and dependent upon the processing time of the other relevant components in the circuit, in particular the separator 22, the digital-to-analogue convertor 23 and the subtractor 24 to overcome any latency offset issues or time-based echo drift.

Figure 4:
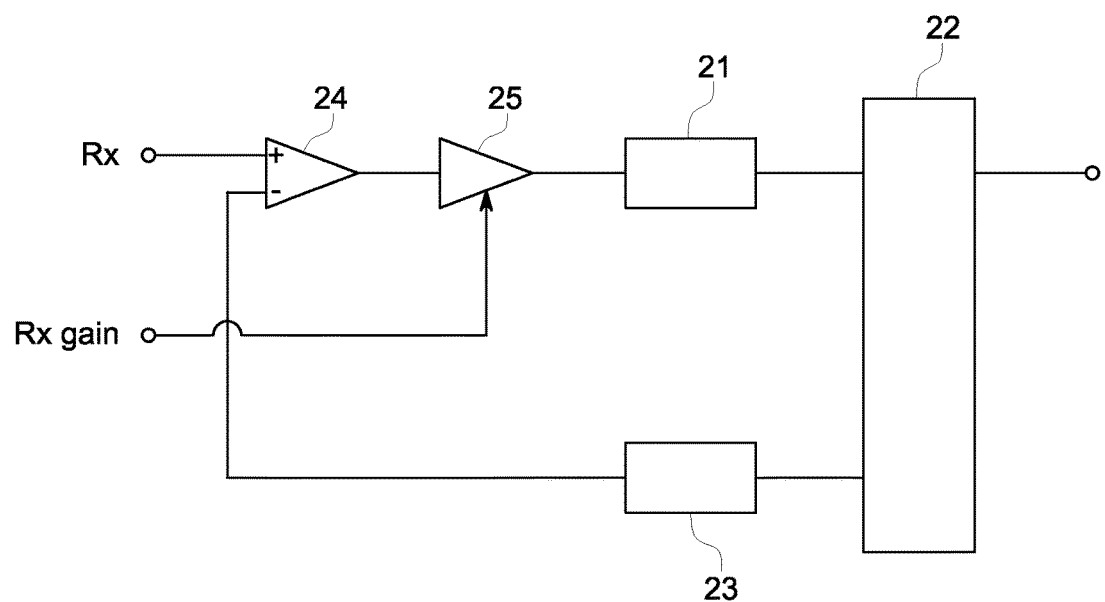
FIG. 4 shows a more detailed example of a system illustrating the present invention.

FIG. 4 shows a more detailed example of the system of FIG. 3 and includes an amplifier 25. In this example the gain of the amplifier 25 may be controlled by an input labelled Rx Gain. The gain of the amplifier 25 may be controlled either manually by an operator or by a controller to more fully utilise the input range of the analogue-to-digital convertor 21 for more precise results even though the peak to peak size or magnitude of the analogue signal corresponding to the flow components may vary. This provides even further enhanced signal to noise ratios giving even more precise results. The function of the amplifier could be included in another component of the system, such as the analogue-to-digital converter 21.

Figure 5:
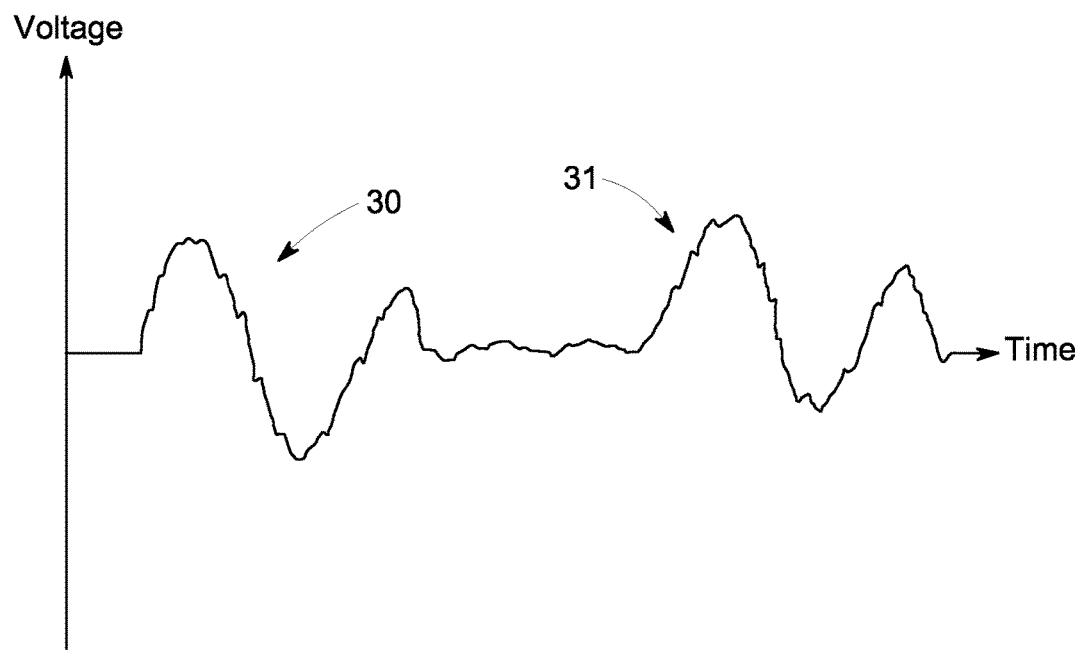
FIG. 5 shows an example a typical received signal from a prior art imaging system.

FIG. 5 illustrates an example of a signal that may be received by a conventional prior art imaging system. As can be seen, the signal is dominated by the static or slow moving elements produced by echoes from conduit walls. In FIG. 5 the first static or slow moving sine wave 30 corresponds to echoes from the near wall 1 in FIG. 1 and the later static or slow moving sine wave 31 corresponds to echoes from the far wall. The echoes from flowing or time-varying media within a conduit can be seen superimposed on the static or slow moving signal and account for only a very small proportion of the overall signal amplitude.

Figure 6:
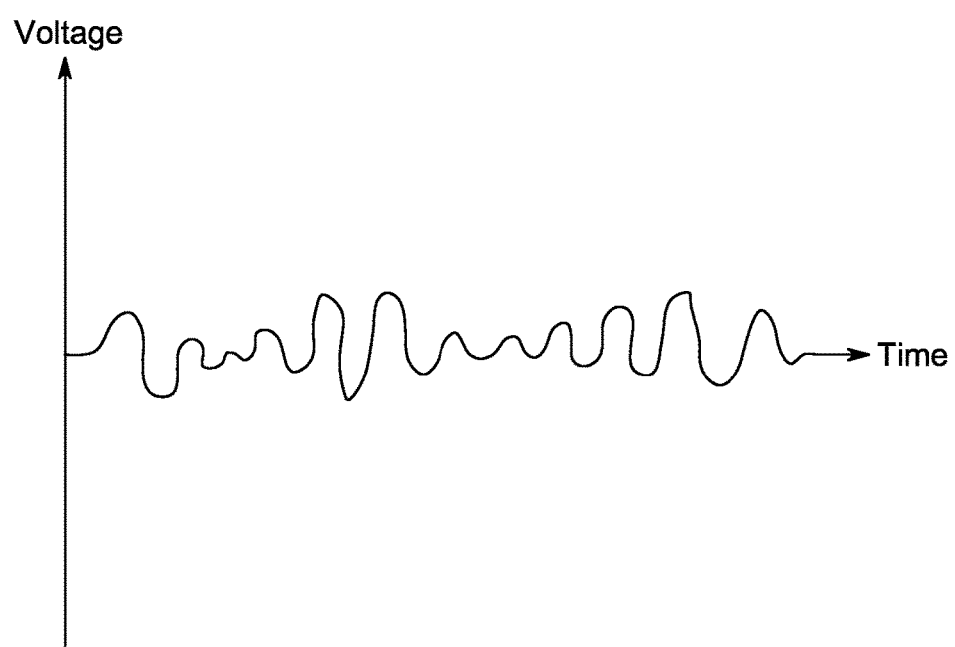
FIG. 6 shows an example of a received signal using an example of a system of the present invention.

In contrast, FIG. 6 shows an example of the analogue signal output by the subtractor 24 in the example of FIG. 3 or FIG. 4 of our description. As can clearly be seen, the removal of the slow moving or static elements 30 from FIG. 5 produce a signal corresponding to the flowing or time-varying media within a conduit with a significantly enhanced signal to noise ratio which when displayed provides a far more precise image of the flowing component.

Figure 7:
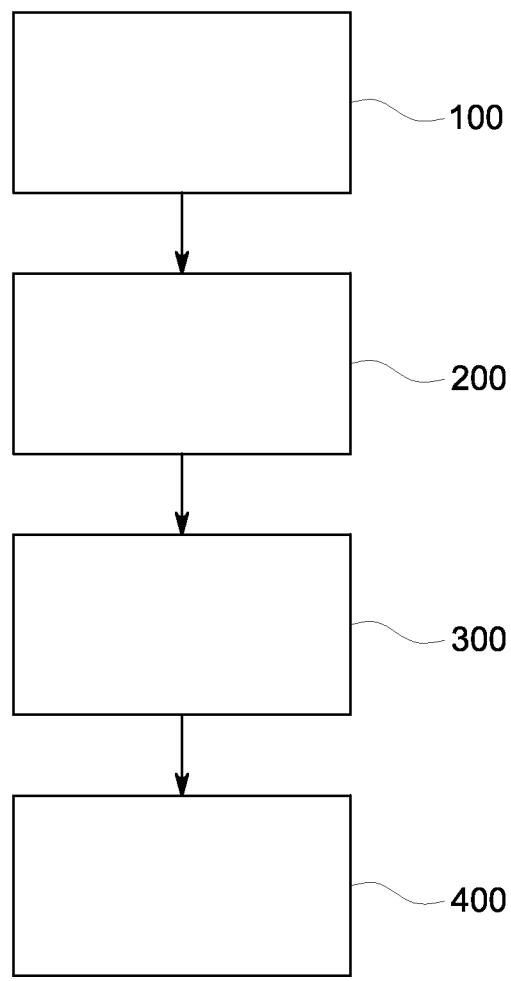
FIG. 7 is a flow diagram of a method illustrating the present invention.

FIG. 7 shows a flow diagram of a method of reducing or removing static or slow moving echoes from a signal, in particular when the static or slow moving echoes are substantially larger than the portion of the signal which is to be displayed. At step 100 an incoming analogue signal from a detector is digitized. At step 200 the static or slow moving components of the digitized signal are separated. The separation may be provided in any suitable way, for example by using a low pass filter, a decimation filter or by a processor. At step 300 the separated static or slow moving components of the signal are converted into an analogue signal. At step 400 the analogue version of the static or slow moving components of the signal are subtracted from an analogue signal received from the detector to produce an analogue signal corresponding to the flow components of the signal. The resultant subtracted signal may then be amplified, digitized, possibly subjected to further processing and may then be displayed. The gain of any amplification may be varied depending upon the magnitude of the resultant subtracted signal to more fully utilize the input range of the analogue-to-digital converter.

The examples described above are able to provide a signal corresponding to the flowing or time-varying fluid within a conduit which is very clear and precise without having to use large and expensive components.

Many variations may be made to the examples described above whilst still falling within the present invention. For example, the components shown in FIGS. 2, 3 and 4 may be provided by any suitable electronic hardware or by software provided on a processor or computer for example. Furthermore, the separator 22 may be provided by any appropriate component such as a low pass filter a decimation filter or by the use of an appropriate software function in a suitable processor or computer.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for reducing echoes in an image, the system comprising:
    an analogue-to-digital converter configured to digitize a received analogue signal received from a detector to a digital signal, wherein the received analogue signal comprises a static or slow moving sine wave;
    a processor configured to digitally separate static components or slow moving components corresponding to temperature variations in a conduit of the digital signal;
    a digital-to-analogue converter configured to provide an analogue version of the separated static or slow moving components of the digital signal;
    a subtractor circuit to subtract the analogue version of the separated static or slow moving components of the digital signal from the received analogue signal received from the detector to produce a resultant analogue signal corresponding to remaining flow components of the digital signal; and
    an amplifier with a controllable gain to receive the resultant analogue signal corresponding to the remaining flow components of the digital signal, wherein the controllable gain of the amplifier is controlled in dependence upon a magnitude of the resultant received analogue signal.

2. The system according to claim 1, wherein the processor is controlled in dependence upon a processing time of other components in the system.

3. An imaging system, comprising:
    a transducer array;
    one or more transmitters;
    one or more receivers; and
    a system for reducing echoes from an image, the system comprising:
    an analogue-to-digital converter configured to digitize a received analogue signal received from a detector to a digital signal, wherein the received analogue signal comprises a static or slow moving sine wave;
    a processor configured to digitally separate static components or slow moving components corresponding to temperature variations in a conduit of the digital signal;
    a digital-to-analogue converter configured to provide an analogue version of the separated static or slow moving components of the digital signal;
    a subtractor circuit to subtract the analogue version of the separated static or slow moving components of the digital signal from the received analogue signal received from the detector to produce a resultant analogue signal corresponding to remaining flow components of the digital signal; and
    an amplifier with a controllable gain to receive the resultant analogue signal corresponding to the remaining flow components of the digital signal, wherein the controllable gain of the amplifier is controlled in dependence upon a magnitude of the resultant received analogue signal.

4. The imaging system according to claim 3, further comprising an output for a display.

5. The imaging system according to claim 3, wherein the processor is controlled in dependence upon a processing time of other components in the system.

6. A method for reducing echoes from an image, the method comprising:
    digitizing an incoming analogue signal received from a detector to a digitized signal, wherein the incoming analogue signal comprises a static or slow moving sine wave and is comprised of static components or slow moving components corresponding to temperature variations in a conduit and flowing components;
    separating the static or slow moving components of the digitized signal;
    converting the separated static or slow moving components into an analogue version; and
    subtracting the analogue version of the static or slow moving components from the incoming analogue signal received from the detector to produce an analogue signal corresponding to flow components of the image,
    wherein resultant subtracted analogue signal corresponding to flow components of the image is amplified, wherein a gain of the amplification is variable depending upon a magnitude of the resultant subtracted analogue signal corresponding to flow components of the image.

* * * * *